(12) United States Patent  
Song et al.

(10) Patent No.: US 9,165,857 B2  
(45) Date of Patent: Oct. 20, 2015

(54) HEAT DISSIPATION LID HAVING DIRECT LIQUID CONTACT CONDUITS

(71) Applicant: Intel Corporation, Santa Clara, CA (US)

(72) Inventors: David W. Song, Chandler, AZ (US); Je-Yong Chang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 270 days.

(21) Appl. No.: 13/672,413

(22) Filed: Nov. 8, 2012

(65) Prior Publication Data

US 2014/0126150 A1    May 8, 2014

(51) Int. Cl.
| H01L 23/34 | (2006.01) |
| H05K 7/20 | (2006.01) |
| H01L 23/473 | (2006.01) |
| H05K 3/30 | (2006.01) |
| H01L 23/427 | (2006.01) |
| H05K 1/02 | (2006.01) |

(52) U.S. Cl.
CPC .......... *H01L 23/473* (2013.01); *H05K 7/20272* (2013.01); *H01L 23/427* (2013.01); *H01L 2224/16* (2013.01); *H01L 2224/73253* (2013.01); *H05K 1/0209* (2013.01); *H05K 3/30* (2013.01); *H05K 7/20218* (2013.01); *H05K 2201/066* (2013.01); *Y10T 29/4913* (2015.01)

(58) Field of Classification Search
CPC ............ H05K 7/20218–7/20272; H01L 23/46; H01L 23/473
USPC ....................... 361/679.46–679.54, 688–723; 165/80.4, 104.33; 257/714–716; 174/15.1
See application file for complete search history.

(56) References Cited

U.S. PATENT DOCUMENTS

| 5,021,924 | A * | 6/1991 | Kieda et al. ................... 361/699 |
| 5,264,984 | A * | 11/1993 | Akamatsu ..................... 361/689 |
| 6,785,134 | B2 * | 8/2004 | Maveety et al. .............. 361/699 |
| 6,980,438 | B2 * | 12/2005 | Huang et al. .................. 361/719 |
| 7,133,286 | B2 * | 11/2006 | Schmidt et al. ............... 361/718 |
| 7,385,817 | B2 * | 6/2008 | Campbell et al. ............. 361/699 |
| 7,511,957 | B2 * | 3/2009 | Campbell et al. ............. 361/699 |
| 7,723,160 | B2 * | 5/2010 | Houle et al. .................. 438/122 |
| 7,781,883 | B2 * | 8/2010 | Sri-Jayantha et al. ........ 257/712 |
| 8,937,810 | B2 * | 1/2015 | Brunschwiler et al. ....... 361/699 |
| 2014/0061893 | A1 * | 3/2014 | Saeidi et al. .................. 257/712 |

* cited by examiner

*Primary Examiner* — Zachary M Pape  
(74) *Attorney, Agent, or Firm* — Winkle, PLLC

(57) ABSTRACT

A heat dissipation lid that includes a plate having a first surface, an opposing second surface, and at least one sidewall extending from the plate second surface. The heat dissipation lid also includes at least one fluid delivery conduit and at least one fluid removal conduit, each extending between the plate first and second surface, and at least one spacing projection extending from the plate second surface to establish and maintain a desired distance between the plate second surface and a microelectronic device, when the heat dissipation lid is positioned to remove heat from the microelectronic device.

34 Claims, 8 Drawing Sheets

HEAT DISSIPATION LID HAVING DIRECT LIQUID CONTACT CONDUITS

TECHNICAL FIELD

Embodiments of the present description generally relate to the field of heat dissipation from a microelectronic device, and, more specifically, to an integrated lid having conduits to direct a liquid to and from the microelectronic device for heat removal.

BACKGROUND ART

The microelectronic industry is continually striving to produce ever faster and smaller microelectronic devices for use in various mobile electronic products, such as portable computers, electronic tablets, cellular phones, digital cameras, and the like. As these goals are achieved, the density of power consumption of integrated circuit components within the microelectronic devices has increased, which, in turn, increases the average junction temperature of the microelectronic device. If the temperature of the microelectronic device becomes too high, the integrated circuits within the microelectronic device may be damaged or destroyed.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
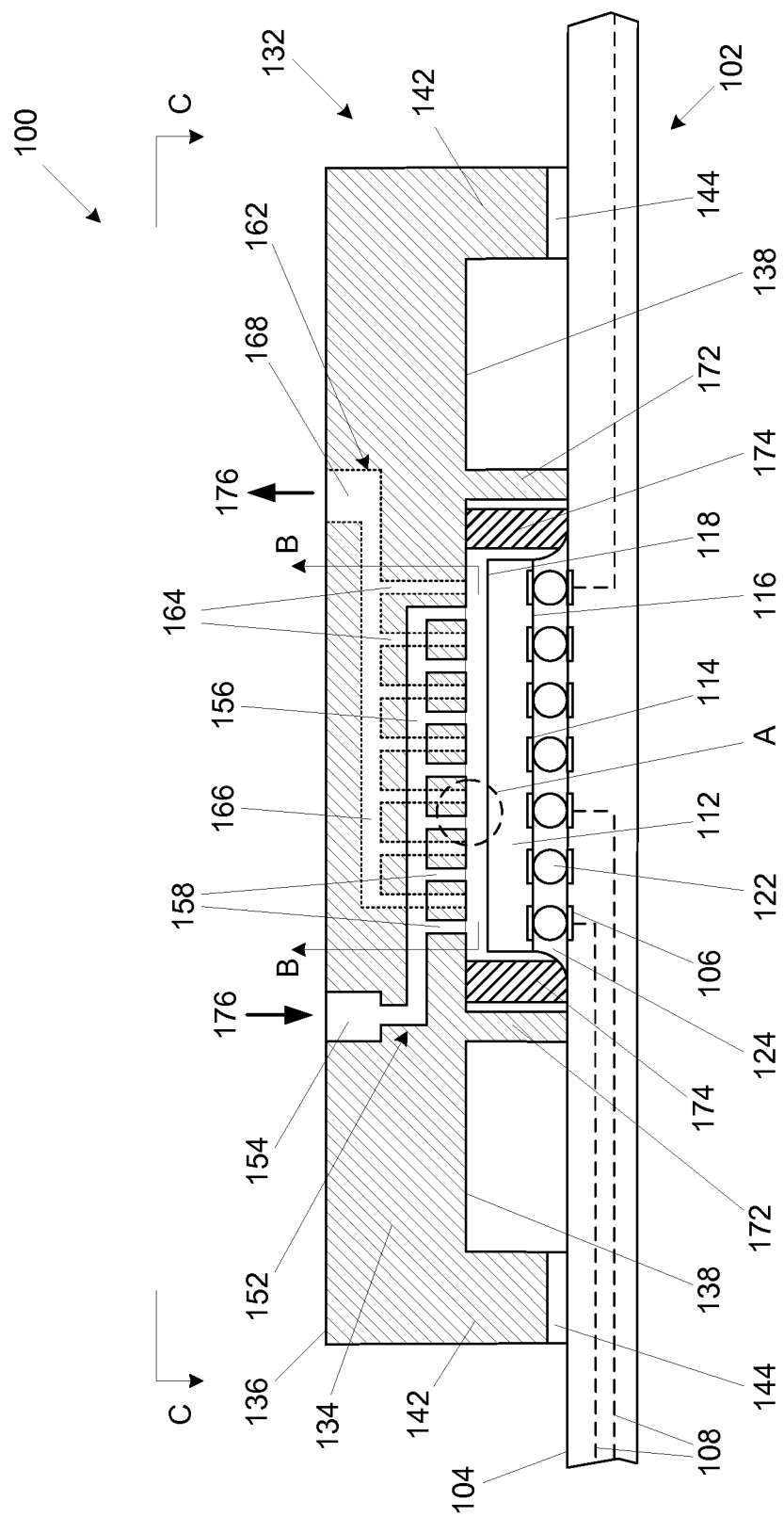
FIG. 1 illustrates a side cross-sectional view of a microelectronic structure including a microelectronic device attached to the microelectronic substrate with a heat dissipation lid attached to the microelectronic substrate spanning the microelectronic device, wherein heat dissipation lid includes conduits for direct fluid contact heat removal, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to a heat dissipation lid that includes a plate having a first surface, an opposing second surface, and at least one sidewall extending from the plate second surface. The heat dissipation lid also includes at least one fluid delivery conduit and at least one fluid removal conduit, each extending between the plate first and second surface, and at least one spacing projection extending from the plate second surface to establish and maintain a desired distance between the plate second surface and a microelectronic device, when the heat dissipation lid is positioned to remove heat from the microelectronic device.

As shown in FIG. 1, a microelectronic structure 100 may be formed by providing or forming a microelectronic substrate 102, such as a printed circuit board, motherboard, or the like. A microelectronic device 112, such as a microprocessor, a multichip package, a chipset, a graphics device, a wireless device, a memory device, an application specific integrated circuit device, and the like, may be attached to a first surface 104 of the microelectronic substrate 102 with a plurality of interconnects 122. The device-to-substrate interconnects 122, such as soldered interconnects, may extend between bond pads 114 formed in or on an active surface 116 of the microelectronic device 112 and substantially mirror-image bond pads 106 in or on the microelectronic substrate first surface 104. An underfill material 124, such as an epoxy material, may be disposed between the microelectronic device active surface 116 and the microelectronic substrate first surface 104. The underfill material 124 may also be a molded underfill material, as known in the art. As will be understood to those skilled in the art, the underfill material 124 may be dispensed between the microelectronic device active surface 116 and the microelectronic substrate first surface 104 as a viscosity liquid and then hardened with a curing process. The underfill material 124 may provide structural integrity and may prevent contamination, as will be understood those skilled in the art.

As further shown in FIG. 1, the microelectronic substrate 102 may provide electrical communication routes (illustrated as dashed lines 108) between the microelectronic device 112 and external components (not shown). As will be understood to those skilled in the art, the microelectronic device bond pads 114 are in electrical communication with integrated circuitry (not shown) within the microelectronic device 112.

As yet further shown in FIG. 1, a heat dissipation lid 132 may be attached to the microelectronic substrate 102. The heat dissipation lid 132 may include a plate 134 having a first surface 136 and an opposing second surface 138, and may have at least one sidewall 142 extending from the plate second surface 138. The heat dissipation lid sidewall(s) 142 may be attached to the microelectronic substrate first surface 104 such that the plate second surface 138 spans, but does not directly contact a back surface 118 (opposing the microelectronic device active surface 116) of the microelectronic device 112. The heat dissipation lid sidewall(s) 142 may be attached to the microelectronic substrate 102 by any appropriate means, including but not limited to an adhesive material 144, such as an epoxy. In one embodiment, the sidewall(s) 142 extend substantially perpendicular to the plate second surface 138.

As still further shown in FIG. 1, the heat dissipation lid 132 may include at least one fluid delivery conduit 152 formed within the plate 134 and extending from the plate first surface 136 to the plate second surface 138. As illustrated in FIG. 1, the fluid delivery conduit 152 may include at least one in-flow port 154, at least one distribution conduit 156, which may run substantially parallel to the plate second surface 138, and at least one inlet port 158 (shown as a plurality of inlet ports 158).

The heat dissipation lid 132 may also include at least one fluid removal conduit 162 formed within the plate 134 and extending from the plate second surface 138 to the plate first surface 136. As illustrated in FIG. 1, the fluid removal conduit 162 may include at least one in outlet port 164 (shown as a plurality of outlet ports 164), at least one collection conduit 166, which may run substantially parallel to the plate second surface 138, and at least one out-flow port 168. The fluid delivery conduit inlet ports 158 and the fluid removal conduit outlet ports 164 may be positioned proximate the microelectronic device back surface 118. The in-flow port 154 and the out-flow port 168 may include quick-connect type plumbing, in order to enable test modules, as will be understood to those skilled in the art.

Figure 2:
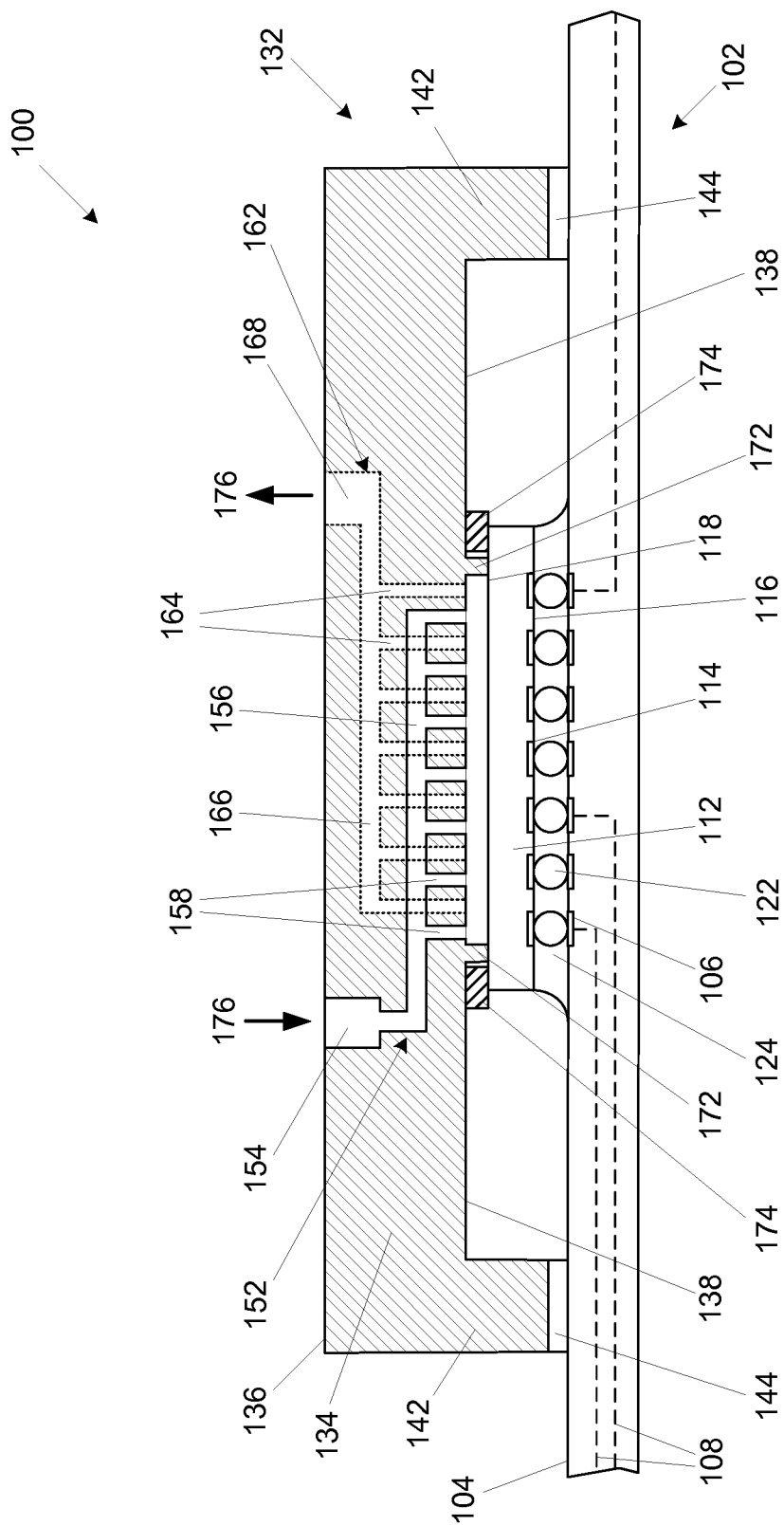
FIG. 2 illustrates a side cross-sectional view of a microelectronic structure including a microelectronic device attached to the microelectronic substrate with a heat dissipation lid attached to the microelectronic substrate spanning the microelectronic device, wherein heat dissipation lid includes conduits for direct fluid contact heat removal, according to another embodiment of the present description.

The heat dissipation lid 132 may further include at least one spacing projection 172 extending from the plate second surface 138. The spacing projection(s) 172 may contact the microelectronic substrate first surface 104 to define a distance D (see FIG. 3) between the microelectronic device back surface 118 and the plate second surface 138, as shown in FIG. 1. In another embodiment, the spacing projection(s) 172 may be attached to the microelectronic substrate first surface 104 with an adhesive layer 182 (see FIG. 7), such as an epoxy, wherein certain embodiments the adhesive may provide a sealing function to the microelectronic device 112. The spacing projection(s) 172 may also contact the microelectronic device back surface 118 to define the distance D (see FIG. 3) between the microelectronic device back surface 118 and the plate second surface 138, as shown in FIG. 2. The spacing projection(s) 172 may have any appropriate shape, including, but not limited to, pillar-shape (see FIG. 10), planar wall-shaped (see FIG. 9), columnar (see FIG. 8), and the like, as will be understood to those skilled in the art. In one embodiment, the spacing projection(s) 172 extend substantially perpendicular to the plate second surface 138.

The microelectronic structure 100 may include a seal 174 to contain a heat dissipation fluid 176 to be introduced through the fluid delivery conduit 152 and removed through the fluid removal conduit 162, as will be discussed. As shown in FIG. 1, the seal 174 may extend from the plate second surface 138 to the microelectronic substrate first surface 104 and/or the underfill material 124. As shown in FIG. 2, the seal 174 may also extend from the plate second surface 138 to the microelectronic device back surface 118. The seal 174 may be formed from any appropriate material capable of forming a fluid tight seal and be substantially inert to the heat dissipation fluid, the microelectronic device, and/or the underfill material. The material forming the seal 174 may include, but is not limited to, silicone, epoxy, and the like. In an embodiment of the present description, the seal 174 may be capable of being thermally cycled (such as an adhesive curing step) without degradation. In another embodiment, the seal 174 may be formed from the same material as the adhesive material 144, such that both the seal 174 and the adhesive material 144 may be simultaneously applied and cured, as will be understood to those skilled in the art.

Figure 3:
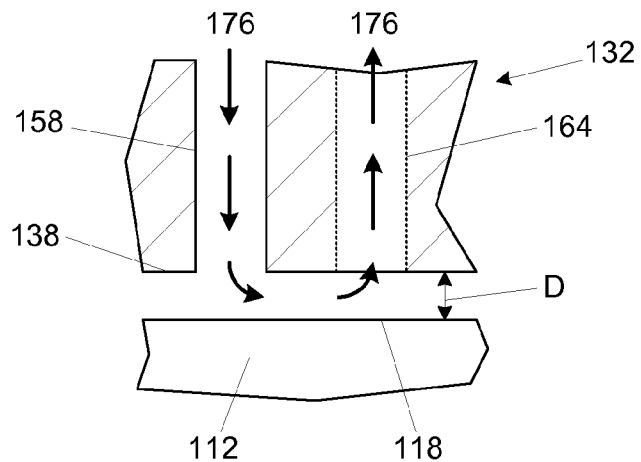
FIG. 3 illustrates a side cross-sectional close-up view of insert A of FIG. 1, according to one embodiment of the present description.

As shown in FIG. 3 (insert A of FIG. 1), the distance D between the plate second surface 138 and the microelectronic device back surface 118 may be determine by the spacing projection(s) 172 (see FIGS. 1 and 2). The distance D allows a heat dissipation fluid (illustrated as arrows 176) to flow in through the at least one fluid delivery conduit 152 to directly contact the microelectronic device back surface 118, wherein heat is transferred from the microelectronic device 112 to the heat dissipation fluid 176, and then the heated heat dissipation fluid 176 may flow out through the at least one fluid removal conduit 162. As will be understood to those skilled in the art, the desired distance D (and, thus, the length of the spacing projection(s) 172) may be determined by the heat dissipation fluid 176 used and its physical properties, including, but not limited to viscosity and thermal conductivity.

In one embodiment, the heat dissipation fluid 176 may be a liquid, including but not limited to, water, alcohol, glycol, combinations thereof, and the like. In another embodiment, the heat dissipation fluid 176 may be a mixture of a liquid and a gas. In still another embodiment, the fluid heat dissipation fluid 176 may be an expandable fluid, such as a refrigerant, such that two-phase flow may be result. For example, the heat dissipation fluid 176 exiting the fluid delivery conduit 152 may be a liquid phase flow, but at least a portion of the heat dissipation fluid 176 may be a vapor or gas phase flow as the heat dissipation fluid 176 enters the fluid removal conduit 162. Accordingly, latent heat of vaporization may be transferred from the microelectronic device back surface 118 into the liquid phase heat dissipation fluid 176 to result in the formation of the vapor or gas phase. Consequently, as will be understood to those skilled in the art, laminar liquid fluid flow may be disrupted and driven toward turbulent flow by flashing (the change from liquid to vapor phase) of the heat dissipation fluid 176. Similarly, already turbulent liquid fluid flow may be disrupted and driven toward more turbulent flow by the flashing of the heat dissipation fluid 176.

Figure 4:
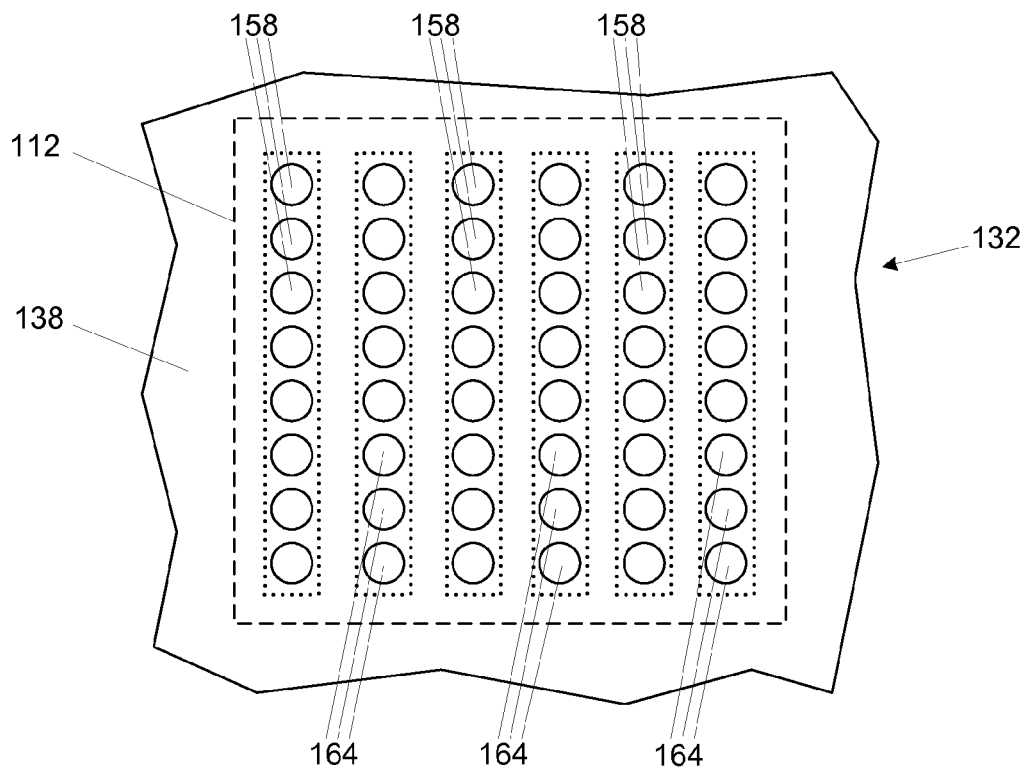
FIG. 4 illustrates a plan view along line B-B of FIG. 1 of a fluid delivery conduit and a fluid removal conduit configuration, according to an embodiment of the present description.
Figure 5:
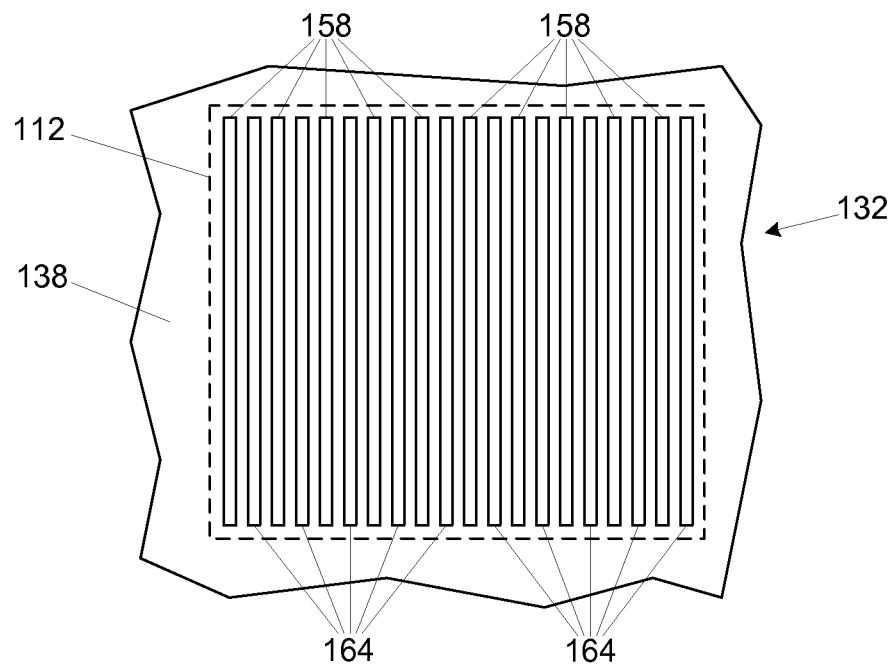
FIG. 5 illustrates a plan view along line B-B of FIG. 1 of a fluid delivery conduit and a fluid removal conduit configuration, according to another embodiment of the present description.
Figure 6:
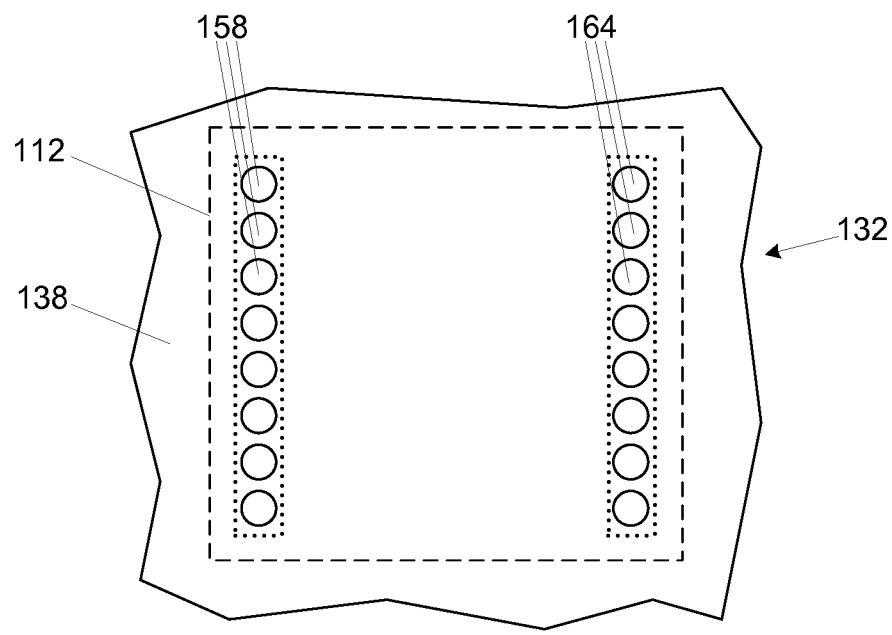
FIG. 6 illustrates a plan view along line B-B of FIG. 1 of a fluid delivery conduit and a fluid removal conduit configuration, according to yet another embodiment of the present description.

The fluid delivery conduit inlet ports 158 and the fluid removal conduit outlet ports 164 may have a variety of configurations. For example, as shown in FIG. 4, the fluid delivery conduit inlet ports 158 and the fluid removal conduit outlet ports 164 may comprise substantially circular apertures configured in alternating rows (indicated with dotted lines). In another example, as shown in FIG. 5, the fluid delivery conduit inlet ports 158 and the fluid removal conduit outlet ports 164 may comprises alternating slotted apertures. In still another example, the fluid delivery conduit inlet ports 158 and the fluid removal conduit outlet ports 164 may be positioned on opposing sides of the microelectronic device 112 (shown in shadow lines in FIGS. 4, 5, and 6 for positional reference). It is understood that the embodiments illustrated in FIGS. 4, 5, and 6 are merely exemplary and that the fluid delivery conduit inlet ports 158 and the fluid removal conduit outlet ports 164 may have any appropriate configuration. Furthermore, there may be a greater number of fluid removal conduit outlet ports 164 or the fluid removal conduit outlet ports 164 may have a larger cross-sectional area than the fluid delivery conduit inlet ports 158, in order to facilitate a two-phase process for the heat dissipation fluid 176, as will be understood to those skilled in the art. Still further, there may be a greater number of fluid removal conduit inlet ports 158 or the fluid removal conduit inlet ports 158 may have a larger cross-sectional area than the fluid delivery conduit outlet ports 164.

Figure 7:
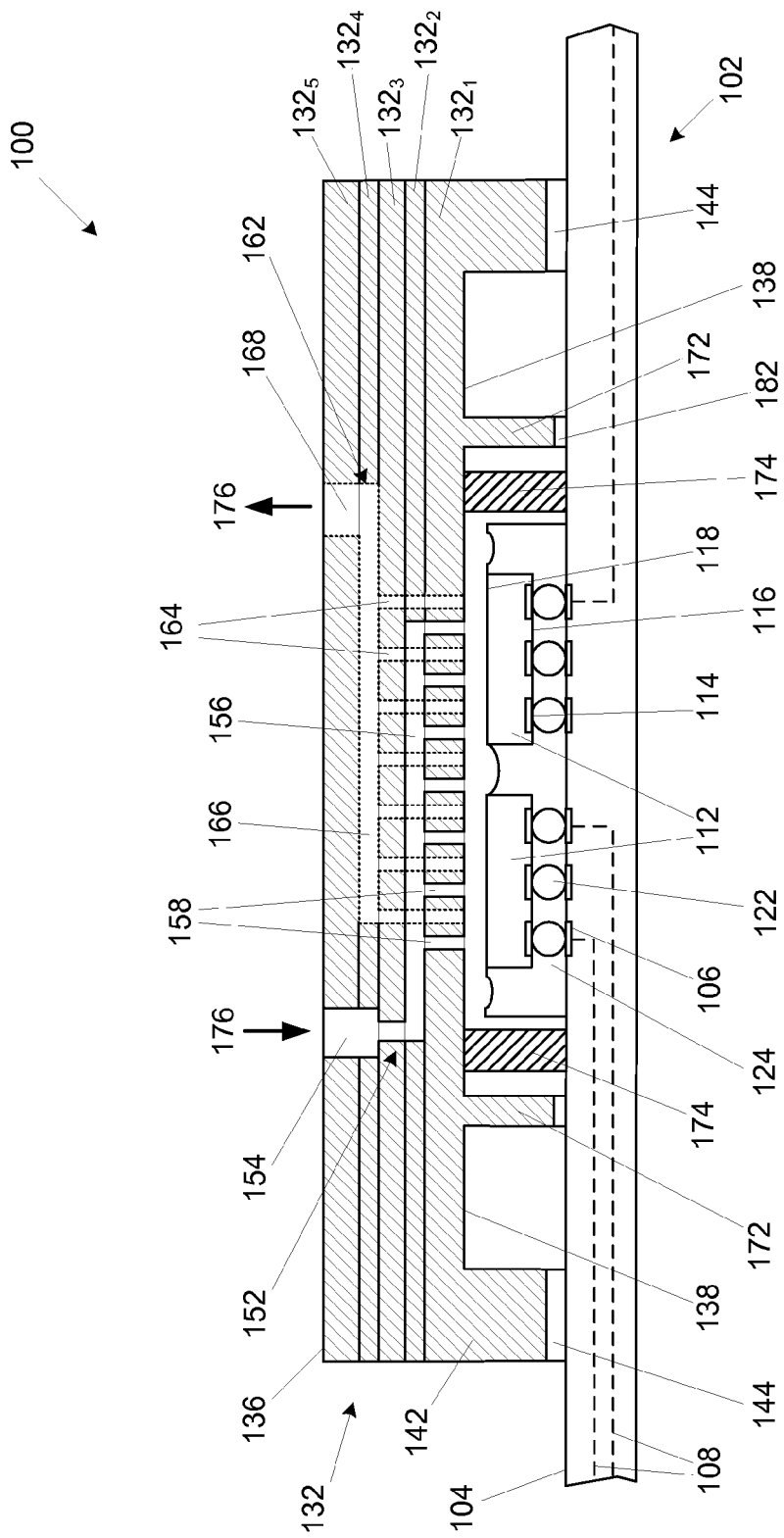
FIG. 7 illustrates a side cross-sectional view of a microelectronic structure including a microelectronic device attached to the microelectronic substrate with a heat dissipation lid attached to the microelectronic substrate spanning the microelectronic device, wherein heat dissipation lid includes conduits for direct fluid contact heat removal, according to still another embodiment of the present description.

As heat dissipation from the microelectronic device 112 is achieved with the heat dissipation fluid 176, the heat dissipation lid 132 need not necessarily be thermally conductive. However, a thermally conductive heat dissipation lid 132 may assist in heat dissipation. Thus, the heat dissipation lid 132 may be formed from any appropriate material, including, but not limited to copper, aluminum, carbon fiber, plastics, and the like. In one embodiment, the heat dissipation lid 132 may be formed from a molding process, such that the heat dissipation lid 132 is a single continuous material. In another embodiment, the plate 134 may be formed separately from the heat dissipation lid sidewalls 142 and attached together. In still another embodiment, the heat dissipation lid 132 may be formed by diffusion bonding or thermal compression bonding of multiple patterned layers, shown as layers 132$_1$, 132$_2$, 132$_3$, 132$_4$, and 132$_5$, as shown in FIG. 7. FIG. 7 also illustrates a multiple microelectronic device 112 configuration with a molded underfill material 124 and an adhesive layer 182 attaching the spacing projection(s) 172 to the microelectronic substrate first surface 104.

Figure 8:
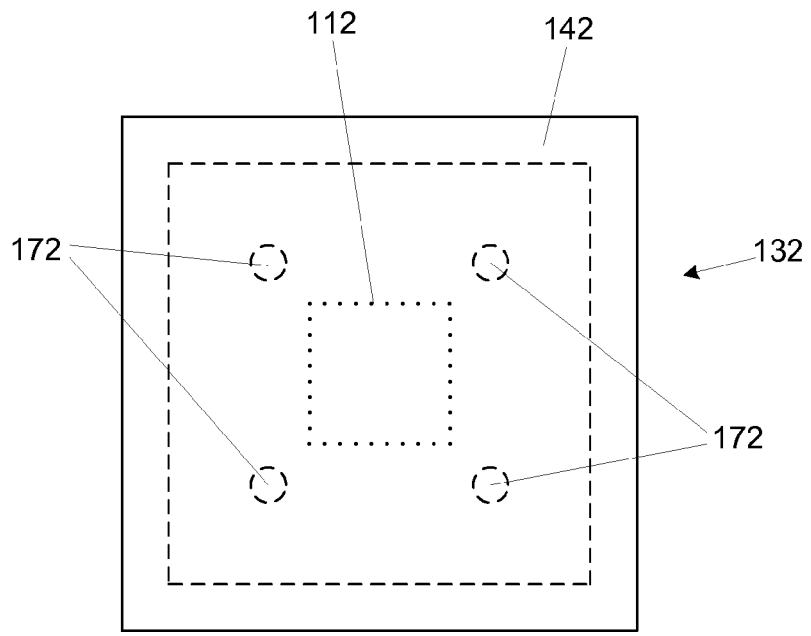
FIG. 8 illustrates a plan view along line C-C of FIG. 1 of a heat dissipation lid sidewall configuration, according to an embodiment of the present description.
Figure 9:
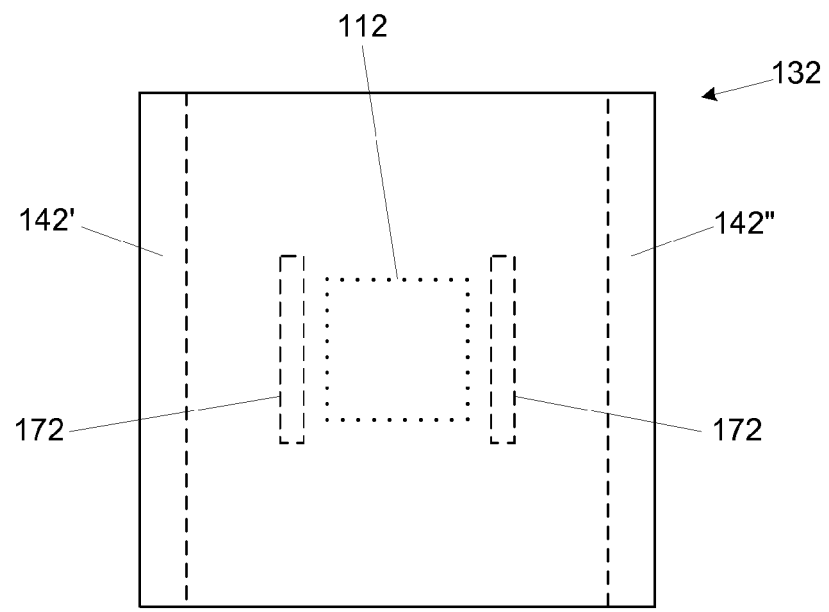
FIG. 9 illustrates a plan view along line C-C of FIG. 1 of a heat dissipation lid sidewall configuration, according to another embodiment of the present description.
Figure 10:
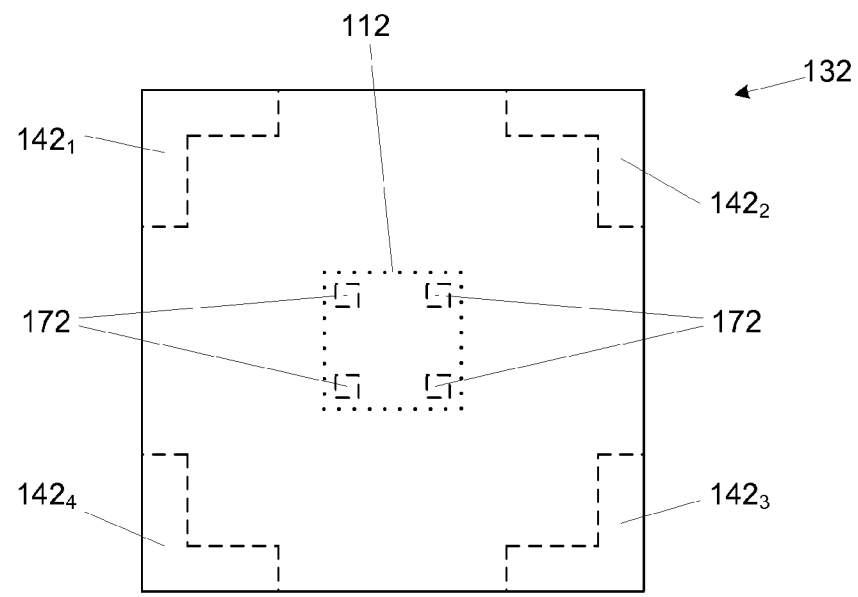
FIG. 10 illustrates a plan view along line C-C of FIG. 1 of a heat dissipation lid sidewall configuration, according to yet another embodiment of the present description.

The heat dissipation lid sidewall(s) 142 may have any appropriate shape and design, including, but not limited a single sidewall 142 (shown in shadow lines in FIG. 8) which would surround the microelectronic device 112 (shown in dotted lines in FIG. 8 to illustrate a relative position thereof), two opposing sidewalls (illustrated as elements 142' and 142" in FIG. 9 in shadow lines), and sidewalls forming corners of the heat dissipation lid 132 (illustrated as elements 142$_1$, 142$_2$, 142$_3$, and 142$_4$ in FIG. 10 in shadow lines). The spacing projection(s) 172 are illustrated as columnar and positioned around the microelectronic device 112 in FIG. 8, as planar wall-shaped adjacent the microelectronic device 112 in FIG. 9, and as pillar-shape contacting the microelectronic device 112 in FIG. 10. It is understood that the embodiments illustrated in FIGS. 8, 9, and 10 are merely exemplary and that the heat dissipation lid sidewall(s) 142 and the spacing projection(s) 172 may have any appropriate shape and configuration.

Figure 11:
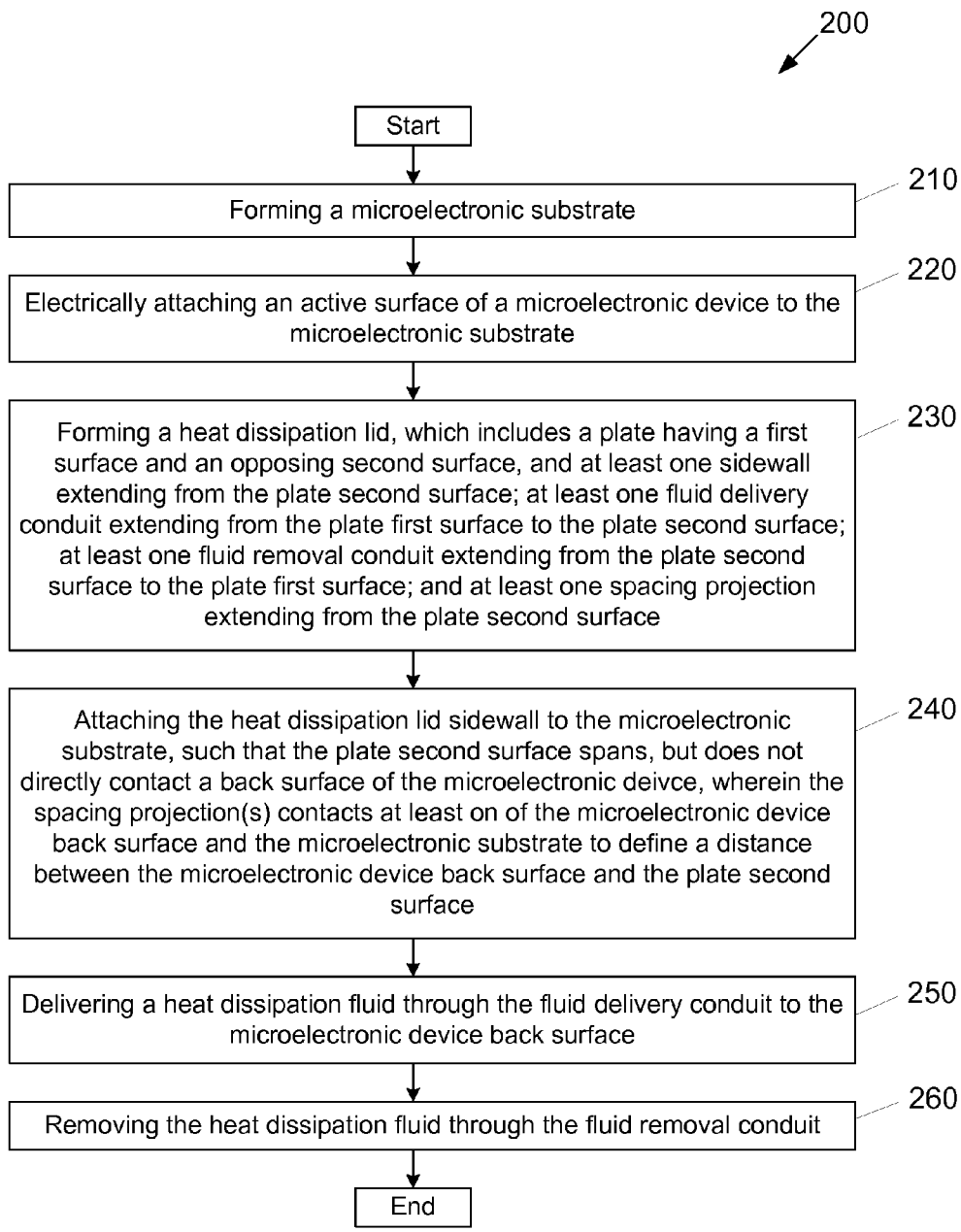
FIG. 11 is a flow chart of a process of mounting and utilizing the heat dissipation lid, according to an embodiment of the present description.

FIG. 11 is a flow chart of a process 200 of fabricating a microelectronic structure according to the various embodiments of the present description. As set forth in block 210, a microelectronic substrate may be formed. A microelectronic device may be electrically attached by its active surface to the microelectronic substrate, as set forth in block 220. As set forth in block 230, a heat dissipation lid may be formed, which includes a plate having a first surface and an opposing second surface, and at least one sidewall extending from the plate second surface; at least one fluid delivery conduit extending from the plate first surface to the plate second surface; at least one fluid removal conduit extending from the plate second surface to the plate first surface; and at least one spacing projection extending from the plate second surface. The heat dissipation lid sidewall(s) may be attached to the microelectronic substrate, such that the plate second surface spans, but does not directly contact a back surface of the microelectronic device, wherein the at least one spacing projection contacts at least one of the microelectronic device back surface and the microelectronic substrate first surface to define a distance between the microelectronic device back surface and the plate second surface, as defined in block 240. As defined in block 250, a heat dissipation fluid may be delivered through the fluid delivery conduit to the microelectronic device back surface. The heat dissipation fluid may be removed through the fluid removal conduit, as defined in block 260.

Figure 12:
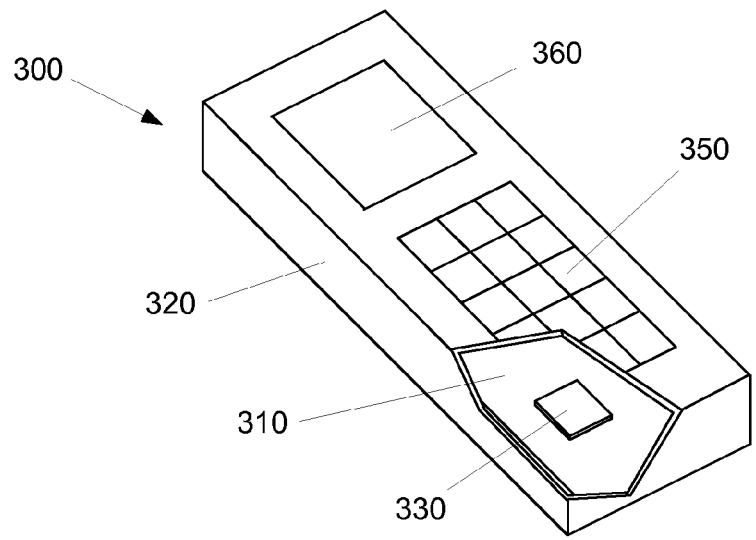
FIG. 12 illustrates an electronic system, according to one embodiment of the present description.

FIG. 12 illustrates an embodiment of an electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic motherboard or substrate 310 disposed within a device housing 320. The microelectronic motherboard/substrate 310 may have various electronic components electrically coupled thereto including a microelectronic device having a heat dissipation lid disposed thereon, as described in the present description. The microelectronic device and the heat dissipation lid are shown generically as element 330 (details of these components have been shown and described with regard to FIGS. 1-9). The microelectronic motherboard 310 may be attached to various peripheral devices including an input device 350, such as keypad, and a display device 360, such an LCD display. It is understood that the display device 360 may also function as the input device, if the display device 360 is touch sensitive.

It is understood that the subject matter of the present description is not necessarily limited to specific applications illustrated in FIGS. 1-11. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic structure, comprising:
    a microelectronic substrate;
    a microelectronic device having an active surface and a back surface, wherein the microelectronic device active surface is electrically attached to a first surface of the microelectronic substrate; and
    a heat dissipation lid, including:
        a plate having a first surface and an opposing second surface, and at least one sidewall extending from the plate second surface, wherein the at least one sidewall is attached to the microelectronic substrate first surface;
        at least one fluid delivery conduit extending from the plate first surface to the plate second surface, wherein the at least one fluid delivery conduit comprises at least one fluid distribution conduit having a plurality of inlet ports extending between the at least one fluid distribution conduit and the plate second surface;
        at least one fluid removal conduit extending from the plate second surface to the plate first surface; and
        at least one spacing projection extending from the plate second surface, wherein the at least one spacing projection contacts at least one of the microelectronic device back surface and the microelectronic substrate to define a distance between the microelectronic device back surface and the plate second surface, such that a heat dissipation fluid directly contacts the microelectronic device back surface.

2. The microelectronic structure of claim 1, wherein the at least one spacing projection comprises a column.

3. The microelectronic structure of claim 1, wherein the at least one spacing projection comprises a wall.

4. The microelectronic structure of claim 1, further including a seal disposed between the plate second surface and the microelectronic substrate.

5. The microelectronic structure of claim 1, further including a seal disposed between the plate second surface and the microelectronic device back surface.

6. The microelectronic structure of claim 1, further including an underfill material disposed between the microelectronic device active surface and the microelectronic substrate.

7. The microelectronic structure of claim 1, wherein the inlet ports comprise circular apertures.

8. The microelectronic structure of claim 1, wherein the inlet ports comprise slotted apertures.

9. The microelectronic structure of claim 1, wherein the at least one fluid removal conduit comprises at least one fluid collection conduit having a plurality of outlet ports extending between the at least one fluid collection conduit and the plate second surface.

10. The microelectronic structure of claim 9, wherein the outlet ports comprise circular apertures.

11. The microelectronic structure of claim 9, wherein the outlet ports comprise slotted apertures.

12. The microelectronic structure of claim 1, wherein the at least one sidewall is attached to the microelectronic substrate with an adhesive material.

13. A method of cooling a microelectronic device, comprising:
    forming a microelectronic substrate;
    electrically attaching an active surface of a microelectronic device to the microelectronic substrate;
    forming a heat dissipation lid, including:
        a plate having a first surface and an opposing second surface, and at least one sidewall extending from the plate second surface,
        at least one fluid delivery conduit extending from the plate first surface to the plate second surface, wherein the at least one fluid delivery conduit includes at least one fluid distribution conduit having a plurality of inlet ports extending between the at least one fluid distribution conduit and the plate second surface;
        at least one fluid removal conduit extending from the plate second surface to the plate first surface; and
        at least one spacing projection extending from the plate second surface;
    attaching the at least one heat dissipation lid sidewall to the microelectronic substrate, such that the plate second surface spans, but does not directly contact a back surface of the microelectronic device, wherein the at least one spacing projection contacts at least one of the microelectronic device back surface and the microelectronic substrate to define a distance between the microelectronic device back surface and the plate second surface;
    delivering a heat dissipation fluid through the at least one fluid delivery conduit to directly contact the microelectronic device back surface; and
    removing the heat dissipation fluid through the at least one fluid removal conduit.

14. The method of claim 13, wherein forming the heat dissipation lid including the at least one spacing projection comprises forming the heat dissipation lid including at least one spacing projection column.

15. The method of claim 13, wherein forming the heat dissipation lid including the at least one spacing projection comprises forming the heat dissipation lid including at least one spacing projection wall.

16. The method of claim 13, further including disposing a seal between the plate second surface and the microelectronic substrate.

17. The method of claim 13, further including disposing a seal between the plate second surface and the microelectronic device back surface.

18. The method of claim 13, further including disposing an underfill material between the microelectronic device active surface and the microelectronic substrate.

19. The method of claim 13, wherein forming the heat dissipation lid including the at least one fluid removal conduit comprises forming the heat dissipation lid including the at least one fluid removal conduit including at least one fluid collection conduit having a plurality of outlet ports extending between the at least one fluid collection conduit and the plate second surface.

20. A microelectronic structure, comprising:
    a microelectronic substrate;
    a microelectronic device having an active surface and a back surface, wherein the microelectronic device active surface is electrically attached to a first surface of the microelectronic substrate; and
    a heat dissipation lid, including:
        a plate having a first surface and an opposing second surface, and at least one sidewall extending from the plate second surface, wherein the at least one sidewall is attached to the microelectronic substrate first surface;
        at least one fluid delivery conduit extending from the plate first surface to the plate second surface;
        at least one fluid removal conduit extending from the plate second surface to the plate first surface, wherein the at least one fluid removal conduit comprises at least one fluid collection conduit having a plurality of outlet ports extending between the at least one fluid collection conduit and the plate second surface; and at least one spacing projection extending from the plate second surface, wherein the at least one spacing projection contacts at least one of the microelectronic device back surface and the microelectronic substrate to define a distance between the microelectronic device back surface and the plate second surface, such that a heat dissipation fluid directly contacts the microelectronic device back surface.

21. The microelectronic structure of claim 20, wherein the at least one spacing projection comprises a column.

22. The microelectronic structure of claim 20, wherein the at least one spacing projection comprises a wall.

23. The microelectronic structure of claim 20, further including a seal disposed between the plate second surface and the microelectronic substrate.

24. The microelectronic structure of claim 20, further including a seal disposed between the plate second surface and the microelectronic device back surface.

25. The microelectronic structure of claim 20, further including an underfill material disposed between the microelectronic device active surface and the microelectronic substrate.

26. The microelectronic structure of claim 20, wherein the outlet ports comprise circular apertures.

27. The microelectronic structure of claim 20, wherein the outlet ports comprise slotted apertures.

28. The microelectronic structure of claim 20, wherein the at least one sidewall is attached to the microelectronic substrate with an adhesive material.

29. A method of cooling a microelectronic device, comprising:
    forming a microelectronic substrate;
    electrically attaching an active surface of a microelectronic device to the microelectronic substrate;
    forming a heat dissipation lid, including:
        a plate having a first surface and an opposing second surface, and at least one sidewall extending from the plate second surface,
        at least one fluid delivery conduit extending from the plate first surface to the plate second surface;
        at least one fluid removal conduit extending from the plate second surface to the plate first surface, wherein the at least one fluid removal conduit includes at least one fluid collection conduit having a plurality of outlet ports extending between the at least one fluid collection conduit and the plate second surface; and
        at least one spacing projection extending from the plate second surface;
    attaching the at least one heat dissipation lid sidewall to the microelectronic substrate, such that the plate second surface spans, but does not directly contact a back surface of the microelectronic device, wherein the at least one spacing projection contacts at least one of the microelectronic device back surface and the microelectronic substrate to define a distance between the microelectronic device back surface and the plate second surface;
    delivering a heat dissipation fluid through the at least one fluid delivery conduit to directly contact the microelectronic device back surface; and
    removing the heat dissipation fluid through the at least one fluid removal conduit.

30. The method of claim 29, wherein forming the heat dissipation lid including the at least one spacing projection comprises forming the heat dissipation lid including at least one spacing projection column.

31. The method of claim 29, wherein forming the heat dissipation lid including the at least one spacing projection comprises forming the heat dissipation lid including at least one spacing projection wall.

32. The method of claim 29, further including disposing a seal between the plate second surface and the microelectronic substrate.

33. The method of claim 29, further including disposing a seal between the plate second surface and the microelectronic device back surface.

34. The method of claim 29, further including disposing an underfill material between the microelectronic device active surface and the microelectronic substrate.

* * * * *